US006313030B1

(12) United States Patent
Kikuta

(10) Patent No.: US 6,313,030 B1
(45) Date of Patent: Nov. 6, 2001

(54) METHOD OF MAKING A CONDUCTIVE LAYER COVERING A HOLE OF DECREASING DIAMETER IN AN INSULATION LAYER IN A SEMICONDUCTOR DEVICE

(75) Inventor: Kuniko Kikuta, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/477,009

(22) Filed: Jan. 3, 2000

Related U.S. Application Data

(62) Division of application No. 09/061,872, filed on Apr. 17, 1998, now Pat. No. 6,051,880.

(30) Foreign Application Priority Data

Apr. 18, 1997 (JP) .................................................. 9-102169

(51) Int. Cl.$^7$ ................................................ H01L 21/4763
(52) U.S. Cl. .......................................... 438/640; 438/648
(58) Field of Search ..................................... 438/628, 629, 438/639, 640, 644, 648, 596, 627, 637, 625; 437/194, 228, 245

(56) References Cited

U.S. PATENT DOCUMENTS

| | | | |
|---|---|---|---|
| 4,656,732 | | 4/1987 | Teng et al. ............................. 438/639 |
| 4,782,380 | | 11/1988 | Shankar et al. ....................... 257/751 |
| 4,857,141 | * | 8/1989 | Abe et al. .............................. 438/640 |
| 4,946,804 | * | 8/1990 | Pritchard et al. ..................... 437/228 |
| 5,350,712 | | 9/1994 | Shibata ................................. 438/629 |
| 5,422,310 | * | 6/1995 | Ito ........................................ 438/639 |
| 5,444,020 | | 8/1995 | Lee et al. .............................. 438/638 |
| 5,514,911 | | 5/1996 | Kim ...................................... 257/774 |
| 5,530,294 | | 6/1996 | Kim ...................................... 257/774 |
| 5,705,429 | * | 1/1998 | Yamaha et al. ....................... 437/194 |
| 5,841,196 | | 11/1998 | Gupta et al. .......................... 257/774 |
| 5,985,754 | * | 11/1999 | Aizawa ................................. 438/639 |

FOREIGN PATENT DOCUMENTS

| | | |
|---|---|---|
| 2-238621 | 9/1990 | (JP) . |
| 7-130681 | 5/1995 | (JP) . |
| 7-130744 | 5/1995 | (JP) . |
| 8-78525 | 3/1996 | (JP) . |

OTHER PUBLICATIONS

"Semiconductor Device and Method of Forming the Same", 87105932, Report No. 241380, 18 pages.

* cited by examiner

Primary Examiner—David Nelms
Assistant Examiner—Phuc T. Dang
(74) Attorney, Agent, or Firm—Young & Thompson

(57) ABSTRACT

The present invention provides a base layer structure formed in a hole having an upper portion which has a larger diameter than other portions thereof. The hole is formed in an insulation layer in a semiconductor device. The base layer structure comprises a base layer which extends on at least a part of the upper portion of the hole and over at least a part of the insulation layer in the vicinity of a top of the hole, wherein the base layer extending on the upper portion has an effective thickness in an elevational direction, which is thicker than a thickness of the base layer over the insulation film and also thicker than a critical thickness which allows that at least a part of the base layer on the upper portion of the hole remains after an anisotropic etching process, whilst the base layer having extended over the insulation layer is etched by the anisotropic etching process.

12 Claims, 10 Drawing Sheets

METHOD OF MAKING A CONDUCTIVE LAYER COVERING A HOLE OF DECREASING DIAMETER IN AN INSULATION LAYER IN A SEMICONDUCTOR DEVICE

CROSS-REFERENCE TO RELATED APPLICATIONS

This application is a divisional of application Ser. No. 09/061,872, filed Apr. 17, 1998 now U.S. Pat. No. 6,051,880.

BACKGROUND OF THE INVENTION

The present invention relates to a semiconductor device, and more particularly to an improved base layer structure covering a contact hole or a via hole formed in an insulation layer in a semiconductor device and a method of forming the same.

In prior art, a semiconductor device with a via hole or a contact hole is formed as follows.

With reference to FIG. 1A, a first inter-layer insulator 3-1 is formed on a silicon substrate 1. A first level interconnection 2 is formed over the first inter-layer insulator 3-1. A second inter-layer insulator 3-2 is formed on the first level interconnection 2. A hole such as a contact hole or a via hole is formed in the second inter-layer insulator 3-2 so that a part of the first level interconnection 2 is shown through the hole. A spontaneous oxide film is removed from the bottom of the hole. An RF sputtering is carried out to edge portions 4 of the hole in the second inter-layer insulator 3-2 so that the edge portions of the hole in the second inter-layer insulator 3-2 are etched to have a curved shape.

With reference to FIG. 1B, a base layer 5 such as a titanium layer or a titanium nitride layer is deposited by a sputtering method onto the surface of the second inter-layer insulator 3-2 and on the bottom and side walls of the hole. An aluminum layer 6 is then deposited by a sputtering method onto the base layer 5 so that the aluminum layer 6 fills the hole and extends over the surface of the second inter-layer insulator 3-2.

The sputtering method may be carried out at an increased substrate temperature. It is also possible to carry out an annealing process in a sputter chamber after the sputtering process was carried out.

If the edges of the hole in the second inter-layer insulator were not etched as illustrated in FIG. 2, the upper portion of the hole may be blocked with the metal layer 6 so that a void 8 is formed in the hole.

In order to avoid the above problem, the edge portions of the hole are etched by the sputtering process so that the edge portions of the hole have a curved shape as illustrated in FIG. 3.

Alternatively, it is also effective for avoiding the above problem to form a tapered hole wherein side walls of the hole are tapered toward the bottom so that a diameter of the hole is decreased downwardly.

Further, alternatively, it is also effective for avoiding the above problem to form recessed upper portions 10 of the hole wherein the recessed portions are formed by wet etching the second inter-layer insulator before the hole is formed by a dry etching.

After the metal layer 6 is deposited, then a photo-resist mask is formed by a photo-lithography technique for subsequent patterning process to the metal layer by a dry etching thereby to form a second level interconnection and a contact layer which provides a connection between the first and second level interconnections.

As the requirement for scaling down of the semiconductor device has been on the increase, the reduction ill diameter of the hole and the reduction in width of the interconnections are also being required. Under these circumstances, it becomes more difficult to carry out an accurate alignment between the hole and the second level interconnection over the hole when a photo-lithography process is made for the formation of the metal interconnection. If the metal interconnection is displaced from the hole. then a part of the metal layer in the upper portion of the hole is also etched by the dry etching process which have, however, carried out to be intended to pattern the metal interconnection as illustrated in FIG. 1C whereby a cavity 7 is formed in the vicinity of the edge portion with the curved shape of the hole.

Since the width and pitch of the interconnections are made narrow, a complete etching to the metal layer for accurate formation of the interconnections requires an over-etching for a relatively long time. If in this case the metal interconnection is displaced from the hole, then the metal layer in the upper portion of the hole is largely etched by the dry etching process. Even if a third inter-layer insulator is then formed over the second level interconnection 6, it is difficult for the third inter-layer insulator fill the cavity 7 as the cavity 7 is extremely narrow. The existence of the cavity 7 in the vicinity of the edge portion of the hole results in formation of a narrowed upper portion of the contact layer. This narrowed upper portion of the contact layer causes a current concentration which may cause a disconnection of the contact layer.

In the above circumstances, it had been required to develop a novel base layer structure formed in a hole such as a contact hole or a via hole in a semiconductor device is free from the above problems.

SUMMARY OF THE INVENTION

Accordingly, it is an object of the present invention to provide a novel base layer structure formed in a hole such as a contact hole or a via hole in a semiconductor device free from the above problems.

It is a further object of the present invention to provide a novel base layer structure formed in a hole such as a contact hole or a via hole in a semiconductor device for avoiding a metal layer in an upper portion of the hole from being etched.

It is a still further object of the present invention to provide a novel semiconductor device with a base layer formed in a hole such as a contact hole or a via hole free from the above problems.

It is yet a further object of the present invention to provide a novel semiconductor device with a base layer formed in a hole such as a contact hole or a via hole for avoiding a metal layer in an upper portion of the hole from being etched.

It is a further more object of the present invention to provide a novel method of forming a semiconductor device with a base layer formed in a hole such as a contact hole or a via hole free from the above problems.

It is still more object of the present invention to provide a novel method of forming a semiconductor device with a base layer formed in a hole such as a contact hole or a via hole for avoiding a metal layer in an upper portion of the hole from being etched.

It is moreover object of the present invention to provide a novel method of forming a semiconductor device with a base layer formed in a hole such as a contact hole or a via hole for avoiding a disconnection of a contact layer in the hole.

It is another object of the present invention to provide a novel method of forming a semiconductor device with a base layer formed in a hole such as a contact hole or a via hole at a high yield.

The above and other objects, features and advantages of the present invention will be apparent from the following descriptions.

The present invention provides a base layer structure formed in a hole having an upper portion which has a larger diameter than other portions thereof. The hole is formed in an insulation layer in a semiconductor device. The base layer structure comprises a base layer which extends on at least a part of the upper portion of the hole and over at least a part of the insulation layer in the vicinity of a top of the hole, wherein the base layer extending on the upper portion has an effective thickness in an elevational direction, which is thicker than a thickness of the base layer over the insulation film and also thicker than a critical thickness which allows that at least a part of the base layer on the upper portion of the hole remains after an anisotropic etching process, whilst the base layer having extended over the insulation layer is etched by the anisotropic etching process.

BRIEF DESCRIPTION OF THE DRAWINGS

Preferred embodiments according to the present invention will be described in detail with reference to the accompanying drawings.

DESCRIPTION OF THE PREFERRED EMBODIMENTS

Figure 1A:
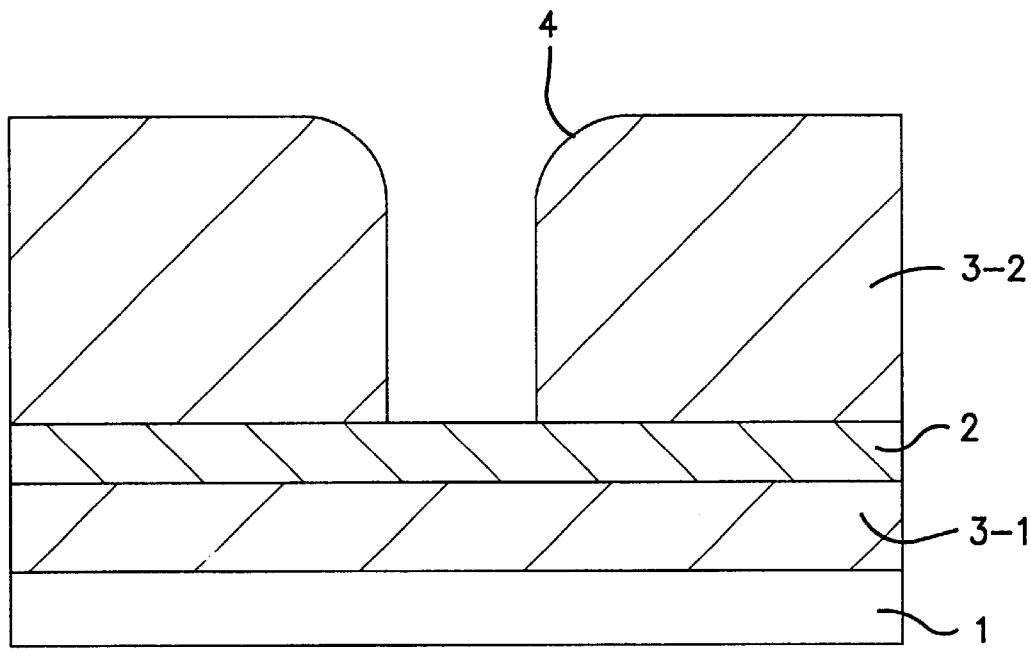
FIGS. 1A through 1C are fragmentary cross sectional elevation views illustrative of semiconductor devices with base layers formed in holes in sequential steps involved in the conventional method of forming the semiconductor device.
Figure 1B:
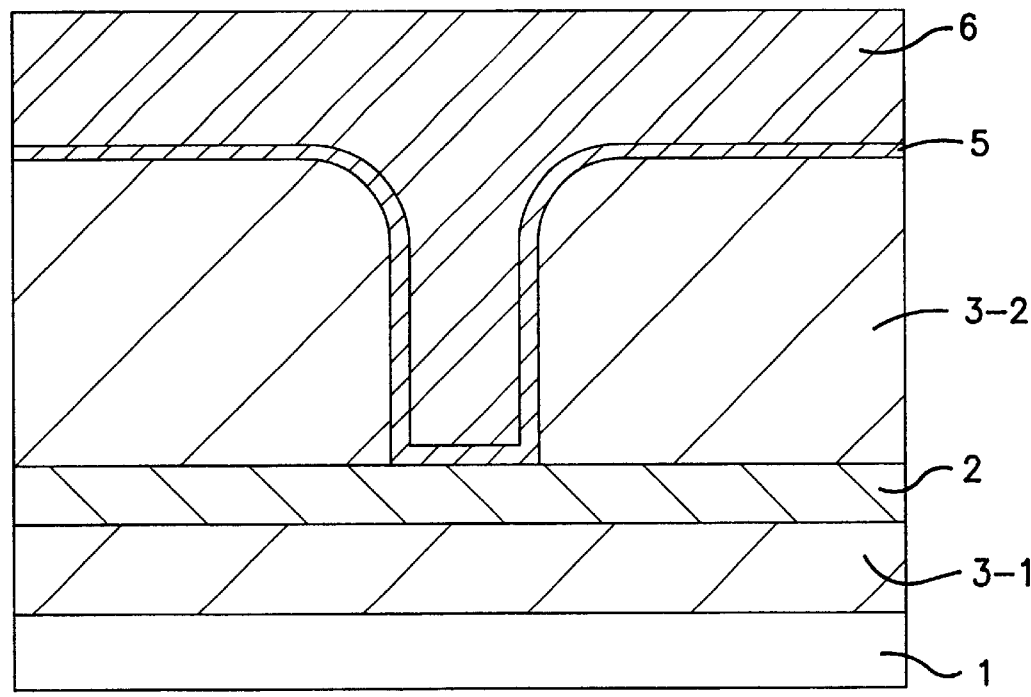
Figure 1C:
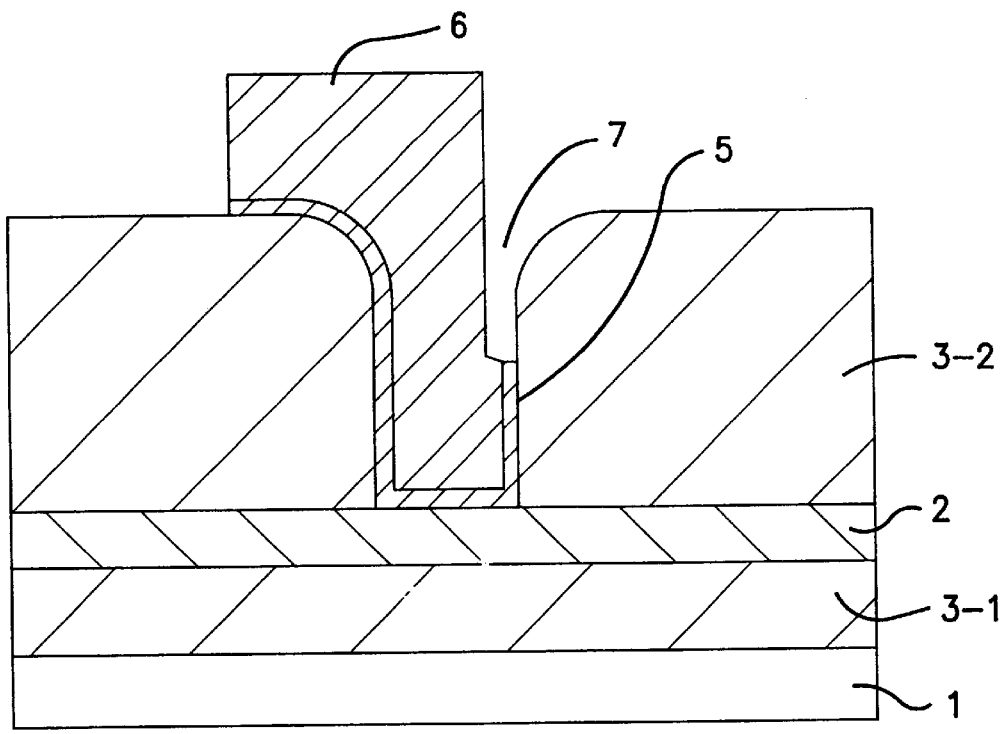
Figure 2:
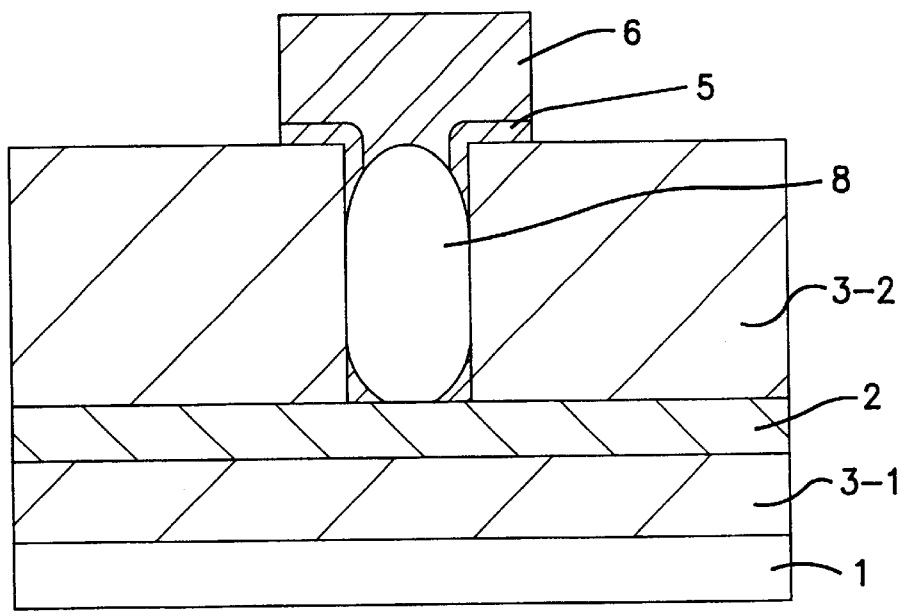
FIG. 2 is a fragmentary cross sectional elevation view illustrative of a conventional semiconductor with a base layer formed in a hole to describe the problem with the conventional fabrication processes.
Figure 3:
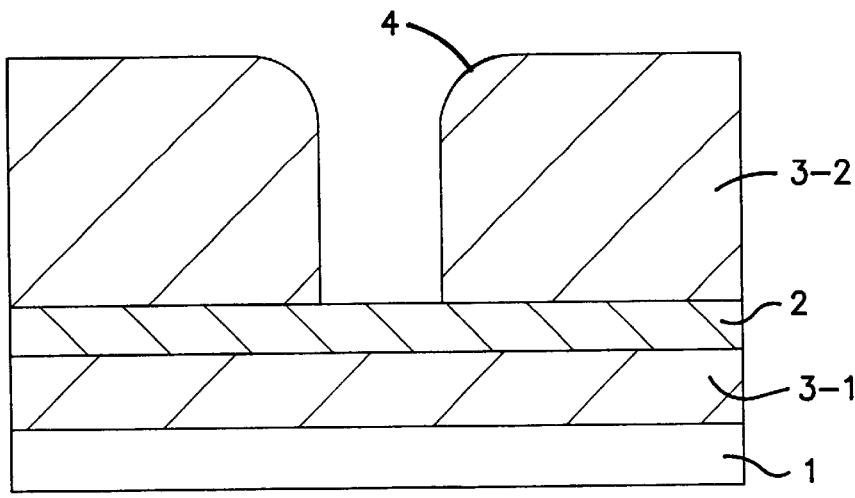
FIG. 3 is a fragmentary cross sectional elevation view illustrative of a semiconductor substrate over which an inter-layer insulator having a hole with a wide top edge portion formed by a sputtering process.
Figure 4:
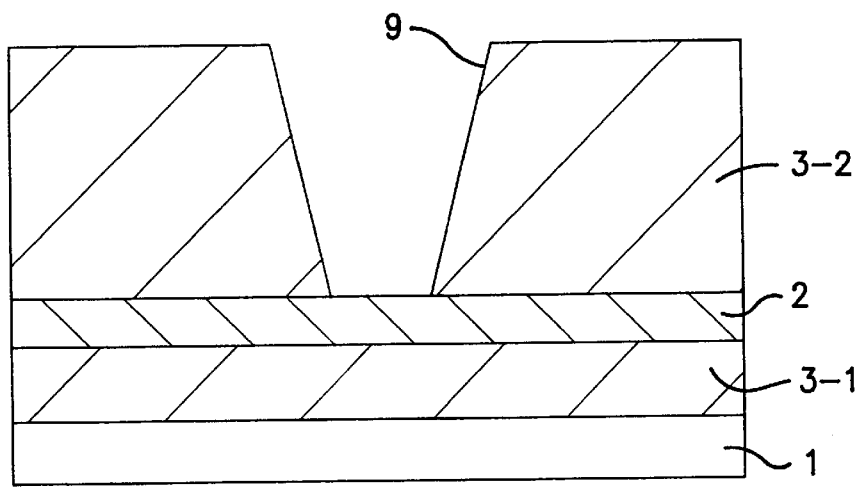
FIG. 4 is a fragmentary cross sectional elevation view illustrative of a semiconductor substrate over which an inter-layer insulator having a hole with tapered side walls so that the hole decreases in diameter downwardly.
Figure 5:
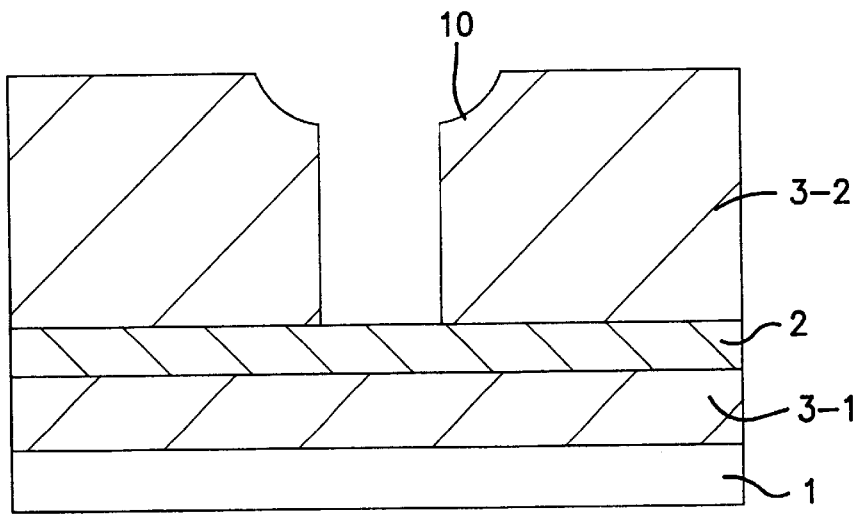
FIG. 5 is a fragmentary cross sectional elevation view illustrative of a semiconductor substrate over which an inter-layer insulator having a hole with recessed edge portions formed by a wet etching process.

The first aspect of the present invention provides a base layer structure formed in a hole having an upper portion which has a larger diameter than other portions thereof. The hole is formed in an insulation layer in a semiconductor device. The base layer structure comprises a base layer which extends on at least a part of the upper portion of the hole and over at least a part of the insulation layer in the vicinity of a top of the hole, wherein the base layer extending on the upper portion has an effective thickness in an elevational direction, which is thicker than a thickness of the base layer over the insulation film and also thicker than a critical thickness which allows that at least a part of the base layer on the upper portion of the hole remains after an anisotropic etching process, whilst the base layer having extended over the insulation layer is etched by the anisotropic etching process.

It is preferable that the base layer extending on the upper portion has a thickness in a direction vertical to surface of the base layer, which is thicker than the base layer extending over the insulation film. In this case, it is further preferable that the base layer extending on the upper portion has a thickness in a direction vertical to surface of the base layer, which is thicker than another parts of the base layer.

It is also preferable that the upper portion of the hole comprises a curved edge with a constant radius.

It is also preferable that the hole has a tapered side wall so that a diameter of the hole is decreased downwardly.

It is also preferable that the upper portion of the hole comprises a recessed portion with a curved shape.

It is also preferable that the base layer extends within the hole to fill the hole and also extends over the insulation layer.

It is also preferable that the base layer extends on one side of the upper portion of the hole.

It is also preferable that the base layer extends on opposite sides of the upper portion of the hole.

It is also preferable that the base layer is provided which extends on a bottom and side walls of the hole as well as the upper portions of the hole and also extends over the insulation film and wherein a metal layer is provided on the base layer to fill the hole.

The second aspect of the present invention provides a base layer structure formed in a hole having an upper portion which has a larger diameter than other portions thereof. The hole is formed in an insulation layer in a semiconductor device. The base layer structure comprises a base layer which extends on at least a part of the upper portion of the hole as well as over at least a part of the insulation layer in the vicinity of a top of the hole, wherein the base layer extending on the upper portion has a thickness in a direction vertical to surface of the base layer, which is thicker than the base layer extending over the insulation film.

It is preferable that the base layer extending on the upper portion has a thickness in a direction vertical to surface of the base layer, which is thicker than another parts of the base layer. In this case, it is further preferable that the upper portion of the hole comprises a curved edge with a constant radius.

It is also preferable that the hole has a tapered side wall so that a diameter of the hole is decreased downwardly.

It is also preferable that the upper portion of the hole comprises a recessed portion with a curved shape.

It is also preferable that the base layer extends within the hole to fill the hole and also extends over the insulation layer.

It is also preferable that the base layer extends on one side of the upper portion of the hole.

It is also preferable that the base layer extends on opposite sides of the upper portion of the hole.

It is also preferable that the base layer is provided which extends on a bottom and side walls of the hole as well as the upper portions of the hole and also extends over the insulation film and wherein a metal layer is provided on the base layer to fill the hole.

It is also preferable that the metal layer comprises an aluminum containing alloy layer.

The third aspect of the present invention provides a semiconductor device comprising an insulation layer, a hole being formed in the insulation layer and also having an upper portion which has a larger diameter than other portions thereof, a base layer which extends on at least a part of the upper portion of the hole as well as over at least a part of the insulation layer in the vicinity of a top of the hole, and a metal layer provided on the base layer, wherein the base layer extending on the upper portion has an effective thickness in an elevational direction, which is thicker than a thickness of the base layer over the insulation film and also thicker than a critical thickness which allows that at least a part of the base layer on the upper portion of the hole remains after an anisotropic etching process, whilst the base layer having extended over the insulation layer is etched by the anisotropic etching process.

It is preferable that the base layer extending on the upper portion has a thickness in a direction vertical to surface of the base layer, which is thicker than the base layer extending over the insulation film. In this case, it is further preferable that the base layer extending on the upper portion has a thickness in a direction vertical to surface of the base layer, which is thicker than another parts of the base layer.

It is also preferable that the upper portion of the hole comprises a curved edge with a constant radius.

It is also preferable that the hole has a tapered side wall so that a diameter of the hole is decreased downwardly.

It is also preferable that the upper portion of the hole comprises a recessed portion with a curved shape.

It is also preferable that the base layer extends within the hole to fill the hole and also extends over the insulation layer
It is also preferable that the base layer extends on one side of the upper portion of the hole.

It is also preferable that the base layer extends on opposite sides of the upper portion of the hole.

It is also preferable that the base layer is provided which extends on a bottom and side walls of the hole as well as the upper portions of the hole and also extends over the insulation film and wherein a metal layer is provided on the base layer to fill the hole.

The fourth aspect of the present invention provides a semiconductor device comprising an insulation layer, a hole formed in the insulation layer and also having an upper portion which has a larger diameter than other portions thereof, a base layer which extends on a bottom portion, side walls and at least a part of the upper portion of the hole as well as over at least a part of the insulation layer in the vicinity of a top of the hole, a metal layer provided on the base layer, wherein the base layer extending on the upper portion has a thickness in a direction vertical to surface of the base layer, which is thicker than the base layer extending over the insulation film.

It is preferable that the base layer extending on the upper portion has a thickness in a direction vertical to surface of the base layer, which is thicker than another parts of the base layer. In this case, it is further preferable that the upper portion of the hole comprises a curved edge with a constant radius.

It is also preferable that the hole has a tapered side wall so that a diameter of the hole is decreased downwardly.

It is also preferable that the upper portion of the hole comprises a recessed portion with a curved shape.

It is also preferable that the base layer extends within the hole to fill the hole and also extends over the insulation layer.

It is also preferable that the base layer extends on one side of the upper portion of the hole.

It is also preferable that the base layer extends on opposite sides of the upper portion of the hole.

It is also preferable that the base layer is provided which extends on a bottom and side walls of the hole as well as the upper portions of the hole and also extends over the insulation film and wherein a metal layer is provided on the base layer to fill the hole.

It is also preferable that the metal layer comprises an aluminum containing alloy layer.

The fifth aspect of the present invention provides a method of forming a semiconductor device comprising the following steps. A hole is formed in an insulation layer so that the hole has an upper portion which has a larger diameter than other portions thereof. A base layer is deposited which extends on at least a part of the upper portion of the hole as well as extends over at least a part of a top surface of the insulation layer in the vicinity of the hole, so that the base layer extending on the upper portion of the hole has an effective thickness in an elevational direction, which is thicker than a thickness of the base layer over the insulation film. A metal layer is deposited on the base layer. The metal layer and the base layer are subjected to an anisotropic etching to selectively etch the metal layer and the base layer so that at least a part of the base layer on the upper portion of the hole remains, whilst the metal layer the base layer having extended over the insulation layer are etched.

It is preferable that the base layer extending is deposited on the upper portion of the hole to have a thickness in a direction vertical to surface of the base layer, which is thicker than the base layer extending over the insulation film. In this case, it is further preferable that the base layer is deposited on the upper portion of the hole to have a thickness in a direction vertical to surface of the base layer, which is thicker than another parts of the base layer.

It is also preferable that the upper portion of the hole is etched by a sputtering method to form a curved edge with a constant radius.

It is also preferable that the hole is formed by an anisotropic etching under such conditions as to form tapered side walls so that a diameter of the hole is decreased downwardly.

It is also preferable that the hole is formed by an isotropic etching method and a subsequent isotropic etching method so that the upper portion of the hole has a wet-etched portion with a curved shape.

It is also preferable that the base layer is deposited within the hole to fill the hole and also over the insulation layer.

It is also preferable that the base layer is etched to finally extend on one side of the upper portion of the hole.

It is also preferable that the base layer is etched to finally extend on opposite sides of the upper portion of the hole.

It is also preferable that the base layer is deposited to extend on a bottom and side walls of the hole as well as the upper portions of the hole and also extend over the insulation film, and then a metal layer is deposited on the base layer to fill the hole.

Figure 6:
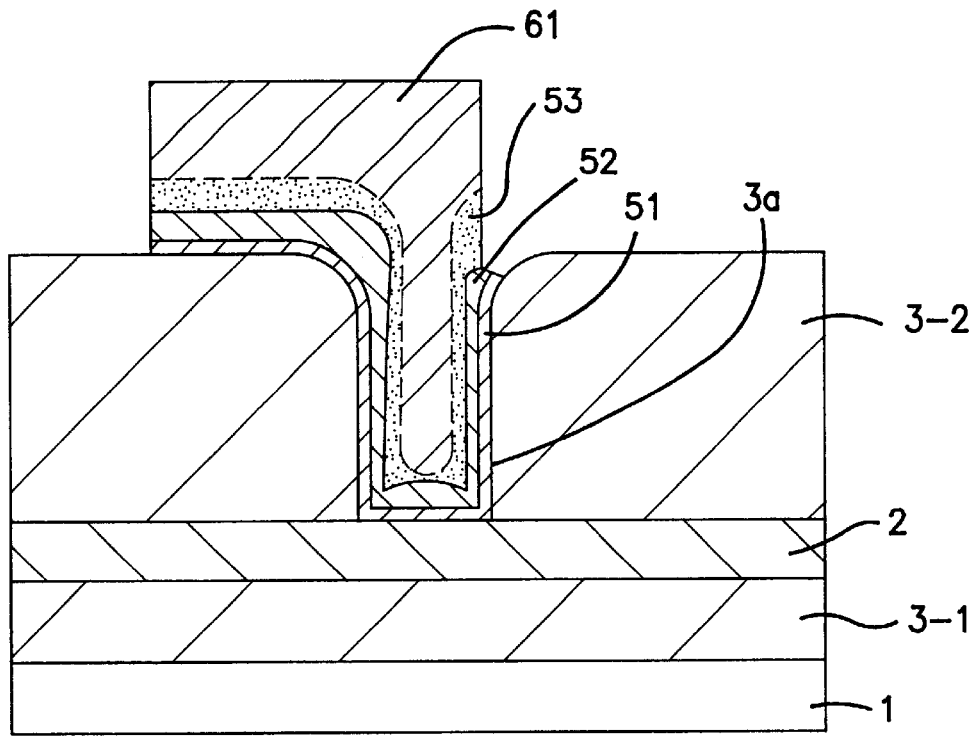
FIG. 6 is a fragmentary cross sectional elevation view illustrative of a semiconductor device with a base layer formed in a hole in a first embodiment in accordance with the present invention.

A first embodiment according to the present invention will be described in detail with reference to FIG. 6 which is illustrative of a semiconductor device with a base layer formed in a hole. A novel semiconductor device has the following structure. A first inter-layer insulator 3-1 is formed on a silicon substrate 1. A first level interconnection 2 or a bottom level interconnection is formed which extends over the first inter-layer insulator 3-1. A second inter-layer insulator 3-2 is formed over the first level interconnection 2. A hole 3a such as a via hole or a contact hole is formed in the second inter-layer insulator 3-2 so that the hole reaches a top of a part of the first level interconnection 2. The hole has an upper portion which is wider in diameter so as to form curved shape edge portions of the hole. A base layer is provided which extends on a bottom portion of the hole, side walls of the hole, and the upper portion of the hole and also extends over a part of a top surface of the second inter-layer insulator 3-2. In one side, the base layer extends up to a part of the upper portion of the hole or to a lower half part of the curved shape edge portion of the hole, but does not extend over an upper half part of the curved shape edge portion of the hole. In another side, the base layer not only extends on the entire of the curved shape edge portion of the hole but also extends over the second inter-layer insulator 3-2 in the vicinity of the hole. The base layer varies in thickness which is measured in a direction vertical to a surface of the base layer so that the base layer on the curved shape edge portion is thicker than any other parts of the base layer extending over the top surface of the second inter-layer insulator 3-2 and also extending on the vertical side walls of the hole and the bottom of the hole. An effective thickness measured in an elevational direction of the base layer over the curved shape edge portion of the hole is thicker than the effective thickness of the base layer over the top surface of the second inter-layer insulator. The effective thickness is here defined to be a thickness when measured in the elevational direction along which the hole extends. The base layer comprises a lamination of a titanium layer 51 on the second inter-layer insulator and a titanium nitride layer 52 on the titanium layer 51. The titanium layer 51 is uniform in thickness when measured in a direction perpendicular to surface of the titanium layer 51. On the other hand, the titanium nitride layer 52 varies in thickness when measured in a direction perpendicular to surface of the titanium layer 51 so that the titanium nitride layer 52 over the curved shape edge portion is thicker than any other parts of the titanium nitride layer 52. An effective thickness measured in an elevational direction of the titanium nitride layer 52 over the curved shape edge portion of the hole is thicker than the effective thickness of the titanium nitride layer 52 over the top surface of the second inter-layer insulator 3-2. A metal layer 61 is provided not only over the hole but also within the hole. A part of the metal layer selectively extends over and in the vicinity of the curved shape edge portion of the hole so that the part of the metal layer serves as a second level interconnection or a top level interconnection, whilst the remaining part of the metal layer exists within the hole to fill the hole so that the remaining part of the metal layer serves as a contact layer which provides an electrical connection between the first level interconnection 2 and the second level interconnection. In the above-noted one side, the metal layer extends up to over the lower half part of the curved shape edge portion of the hole but does not extend over the upper half part of the curved shape edge portion of the hole and also does not extend over the top surface of the second inter-layer insulator 3-2. In the above-noted other side, the metal layer extends not only over the entire of the curved shape edge portion of the hole but also extends over the top surface of the second inter-layer insulator 3-2, however, in the vicinity of the hole. The metal layer comprises an Al—Ti alloy layer 53 in contact with the titanium nitride layer 52 and an Al—Cu layer 61.

The titanium nitride layer has a lower etching rate than that of the aluminum containing layer. The above thickness-increased portion of the base layer over the curved shape edge portion of the hole serves as an etching stopper which prevents the metal layer in the upper portion of the hole from being etched by a dry etching process which is carried out for patterning the metal layer to define the second level interconnection even if the dry etching process is not so excessive over-etching.

The following descriptions will focus on the novel method of forming the above semiconductor device with reference to FIGS. 7A through 7D.

Figure 7A:
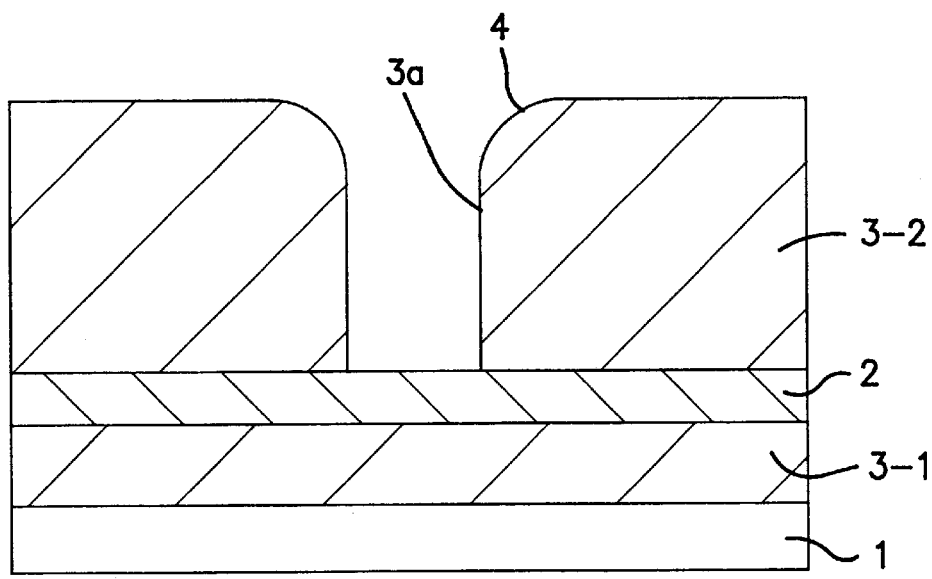
FIGS. 7A through 7D are fragmentary cross sectional elevation views illustrative of semiconductor devices with base layers formed in holes in sequential steps involved in a novel method of forming the semiconductor device in a first embodiment in accordance with the present invention.

With reference to FIG. 7A, a first inter-layer insulator 3-1 is formed on a silicon substrate 1. A first level interconnection 2 is formed on the first inter-layer insulator 3-1. A second inter-layer insulator 3-2 is formed over the first level interconnection 2. A hole 3a is formed in the second inter-layer insulator 3-2 by a photo-lithography technique and subsequent dry etching process. Thereafter, the edge portion of the hole in the second inter-layer insulator 3-2 is etched by a sputtering process so that the edge portion of the hole has a curved shape with a constant radius. The amount of etching to the edge portion of the hole in the second inter-layer insulator is determined in consideration of desired device size, for example, about 50 nm.

Figure 7B:
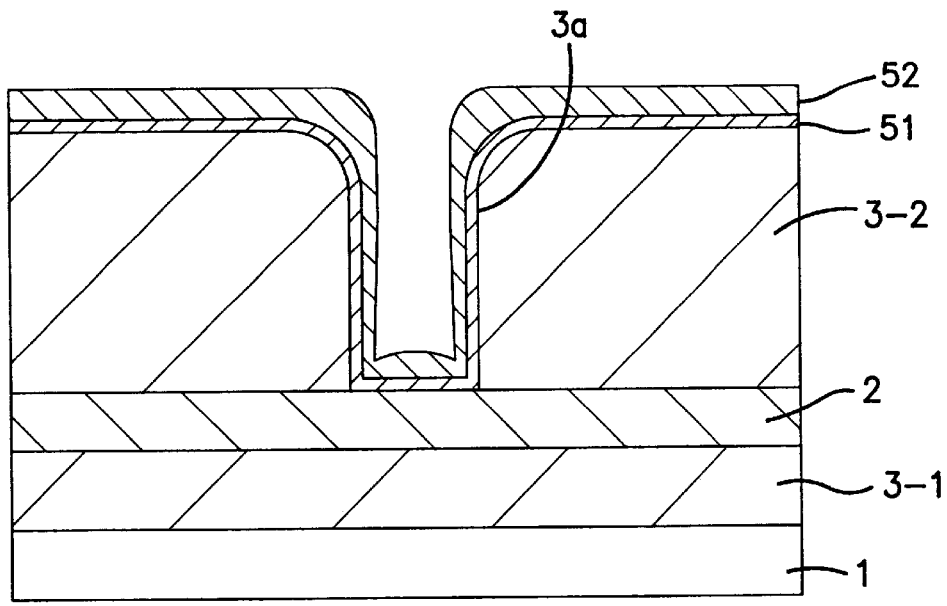

With reference to FIG. 7B, a titanium film 51 having a thickness of 20 nanometers is deposited which extends over the top surface of the second inter-layer insulator 3-2, and also extends on curved shape upper portion and vertical side walls of the hole as well as the bottom portion of the hole. A titanium nitride film 52 having a thickness of 50 nanometers is then formed on the titanium film 51. The thickness of the titanium nitride film 52 over the curved shape upper portion of the hole is thicker than the other parts of the titanium nitride film 52, wherein the thickness is defined by measuring the titanium nitride film 52 in a direction perpendicular to the surface of the titanium nitride film 52.

Particularly the thickness of the titanium nitride film 52 over the curved shape upper portion of the hole is thicker than the part of the titanium nitride film 52 on the bottom of the hole.

Figure 7C:
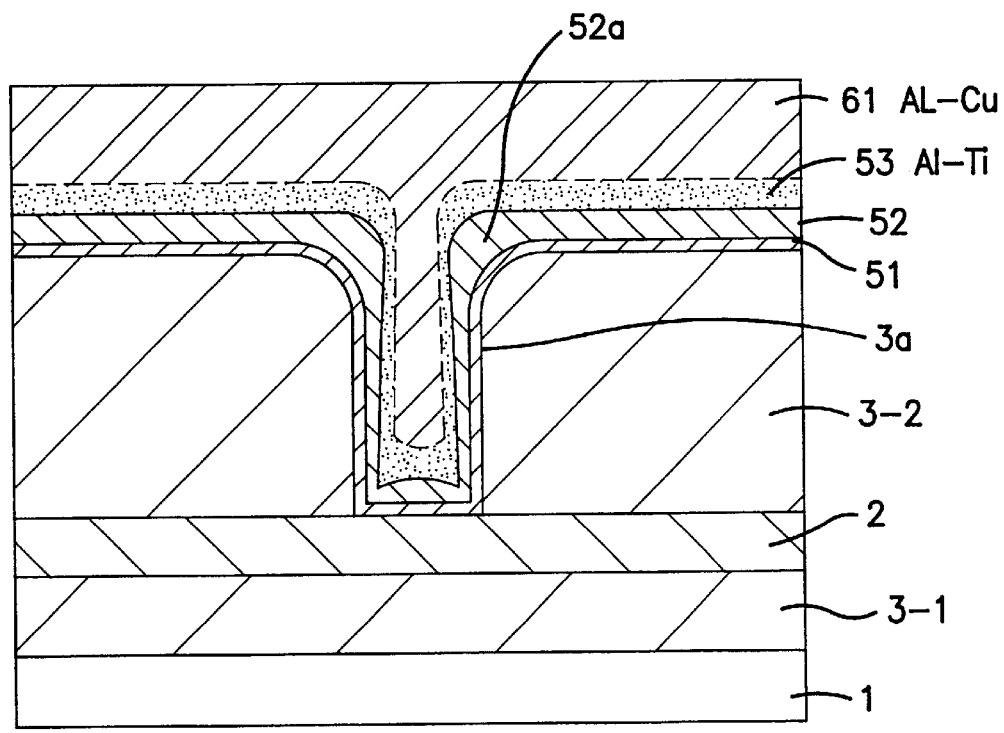

With reference to FIG. 7C, an aluminum film having a thickness of 4.0 nanometers is deposited on the titanium nitride film 52, wherein titanium atoms exist on a top surface of the titanium nitride film 52. As a result, aluminum atoms in the aluminum film being now deposited are made into contact with titanium atoms in the titanium nitride film 52 whereby aluminum atoms are reacted with titanium atoms to form an Al—Ti alloy film 53. Further, an Al—Cu film 61 is deposited on the Al—Ti alloy film 53. The Al—Cu film 61 is deposited by a sputtering method at 10 kW to have a thickness of 0.3 micrometers and subsequently deposited at 0.8 kW to have a thickness of 0.4 micrometers. In this sputtering process, a heater block supporting the substrate is maintained at a temperature of about 500° C. During the deposition of the Al—Cu film of 0.3 micrometers in thickness, the substrate temperature is kept low without flow of Ar gas from the bottom side to the substrate. On the other hand, during the other deposition of the Al—Cu film of 0.4 micrometers in thickness, the substrate temperature is kept high, for example, at about 450° C. with an injection of Ar gas from the bottom side to the substrate. The substrate temperature may be allowed to be dropped by changing the conditions of the Al—Cu depositions The hole is thereby completely filled with the laminations of the Al—Ti alloy film 53 and the Al—Cu film 61.

Figure 7D:
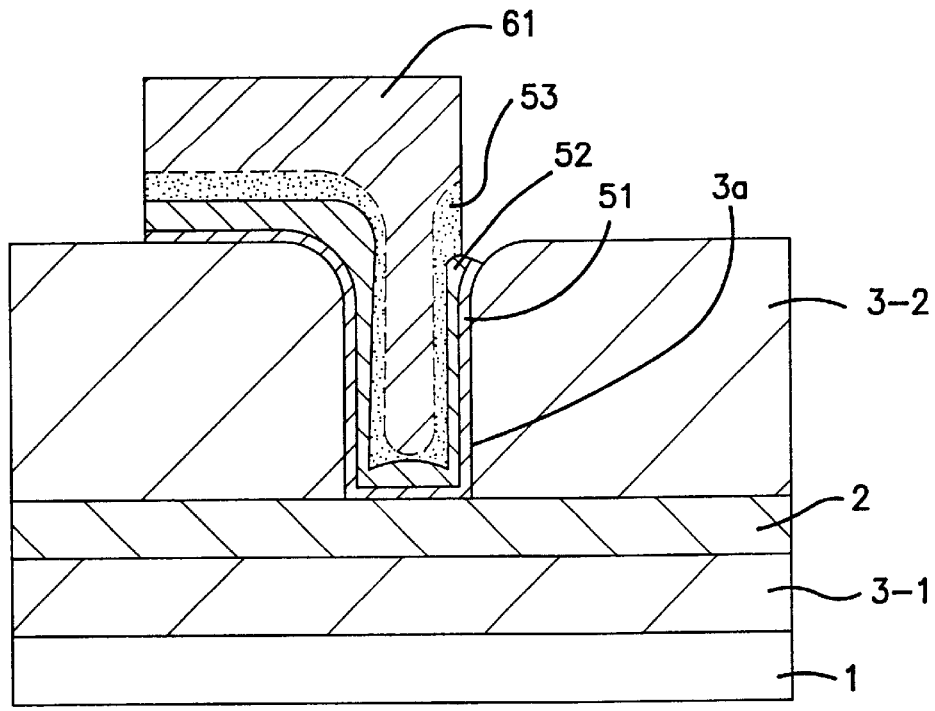

With reference to FIG. 7D, a photo-resist pattern is formed over the Al—Cu film 61 by a photo-lithography process so that the laminations of the Al—Cu film 61, the Al—Ti alloy film 53, the titanium nitride film 52 and the titanium film 51 are patterned by a dry etching process using the photo-resist as a mask. Even if the photo-resist pattern is displaced from the hole 3a by error and an over-etching is carried out, then the thickness increased portion of the titanium nitride film 52 over the curved shape edge portion of the hole can serve as an etching stopper which is capable of preventing any etching to the Al—Ti alloy film 53 and the Al—Cu film in the upper portion of the hole. This allows a high yield of the semiconductor devices. The fabrication steps for the semiconductor device may be reduced and the manufacturing cost for the semiconductor device may also be reduced.

Figure 8:
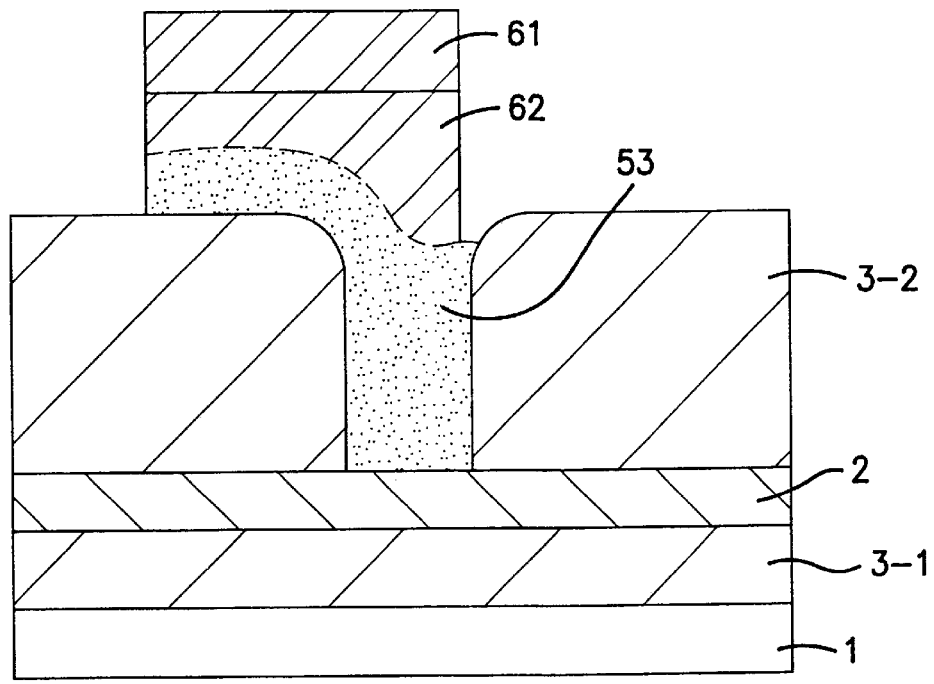
FIG. 8 is a fragmentary cross sectional elevation view illustrative of a semiconductor device with a base layer formed in a hole in a second embodiment in accordance with the present invention.

A second embodiment according to the present invention will be described in detail with reference to FIG. 8 which is illustrative of a semiconductor device with a base layer formed in a hole. A novel semiconductor device has the following structure. A first inter-layer insulator 3-1 is formed on a silicon substrate 1. A first level interconnection 2 or a bottom level interconnection is formed which extends over the first inter-layer insulator 3-1. A second inter-layer insulator 3-2 is formed over the first level interconnection 2. A hole 3a such as a via hole or a contact hole is formed in the second inter-layer insulator 3-2 so that the hole 3a reaches a top of a part of the first level interconnection 2. The hole 3a has an upper portion which is widen in diameter so as to form curved shape edge portions of the hole. A base layer 53 is provided which extends within the hole and over a part of a top surface of the second inter-layer insulator 3-2. In one side, the base layer 53 extends up to a part of the upper portion of the hole or to a lower half part of the curved shape edge portion of the hole, but does not extend over an upper half part of the curved shape edge portion of the hole. In another side, the base layer 53 not only extends on the entire of the curved shape edge portion of the hole but also extends over the second inter-layer insulator 3-2 in the vicinity of the hole. The base layer 53 varies in effective thickness which is measured in an elevational direction along which the hole 3a extends so that the base layer 53 on the curved shape edge portion is thicker in elevational direction than the parts of the base layer 53 over the second inter-layer insulator 3-2. The effective thickness measured in an elevational direction of the base layer over the curved shape edge portion of the hole is thicker than the effective thickness of the base layer over the top surface of the second inter-layer insulator 3-2. The effective thickness is here defined to be a thickness when measured in the elevational direction along which the hole extends. The base layer 53 may comprise an electrically conductive film such as aluminum titanium film which, however, has a lower etching rate than that of aluminum containing metal layer so that the base layer 53 can serve as an etching stopper. A metal layer is provided on the base layer 53. The metal layer selectively extends over the curved shape edge portion of the hole and the top surface of the second inter-layer insulator so that the part of the metal layer serves as a second level interconnection or a top level interconnection. In the above one side, the metal layer extends up to over the lower half part of the curved shape edge portion of the hole but does not extend over the upper half part of the curved shape edge portion of the hole and also does not extend over the top surface of the second inter-layer insulator 3-2. In the above other side, the metal layer extends not only over the entire of the curved shape edge portion of the hole but also extends over the top surface of the second inter-layer insulator 3-2, however, in the vicinity of the hole. The metal layer comprises an aluminum layer 62 in contact with the aluminum titanium layer 53 and an Al—Cu layer 61.

The aluminum titanium layer has a lower etching rate than that of the aluminum containing layer such as Al—Cu layer. The above thickness-increased portion of the base layer over the curved shape edge portion of the hole serves as an etching stopper which prevents the base layer in the upper portion of the hole from being etched by a dry etching process which is carried out for patterning the metal layer to define the second level interconnection even if the dry etching process is not so excessive over-etching.

The following descriptions will focus on the novel method of forming the above semiconductor device with reference to FIGS. 9A through 9D.

Figure 9A:
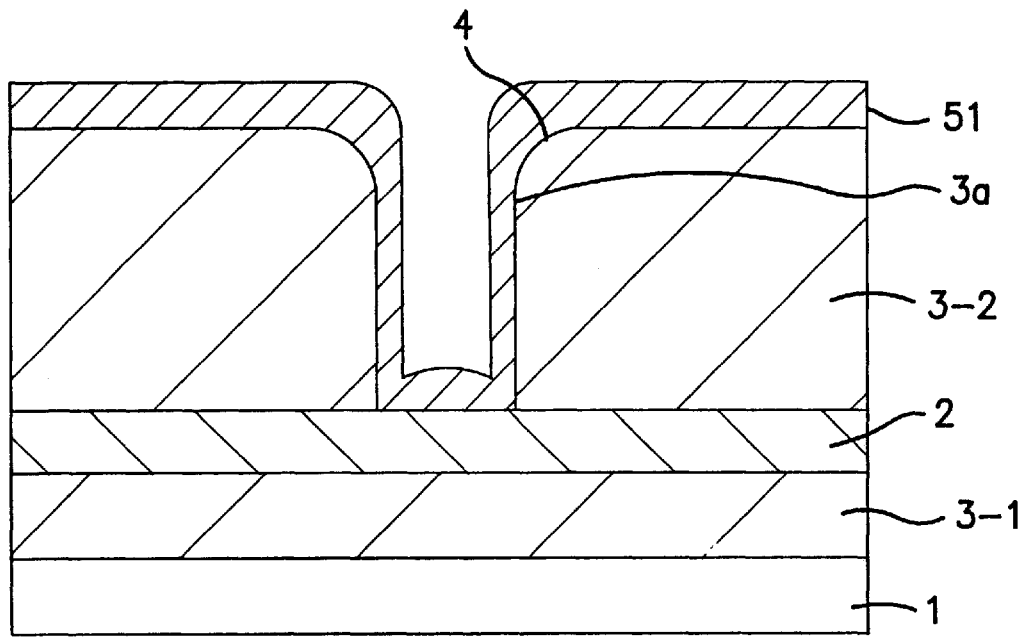
FIGS. 9A through 9D are fragmentary cross sectional elevation views illustrative of semiconductor devices with base layers formed in holes in sequential steps involved in a novel method of forming the semiconductor device in a second embodiment in accordance with the present invention.

With reference to FIG. 9A, a first inter-layer insulator 3-1 is formed on a silicon substrate 1. A first level interconnection 2 is formed on the first inter-layer insulator 3-1. A second inter-layer insulator 3-2 is formed over the first level interconnection 2. A hole 3a is formed in the second inter-layer insulator 3-2 by a photo-lithography technique and subsequent dry etching process. Thereafter, the edge portion of the hole in the second inter-layer insulator 3-2 is etched by a sputtering process so that the edge portion of the hole has a curved shape with a constant radius. The amount of etching to the edge portion of the hole in the second inter-layer insulator is determined in consideration of desired device size, for example, about 50 nm. A titanium film 51 is deposited on the top surface of the second inter-layer insulator 3-2 and also on the bottom portion and vertical side walls of the hole as well as on the curved shape edge portion of the hole. The titanium film 51 has a thickness, for example, not less than 50 nanometers which is thicker than that by which the edge portion of the hole was etched by sputtering process.

Figure 9B:
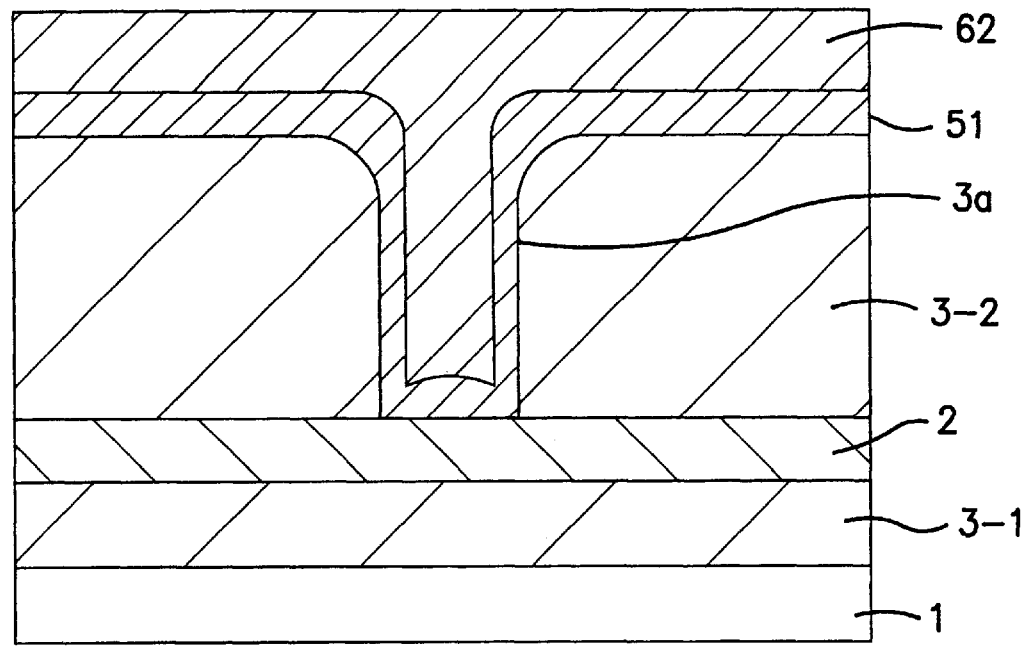

With reference to FIG. 9B, an aluminum film 62 is deposited on the titanium film 51 by a chemical vapor deposition so that the aluminum film 62 extends within the hole and over the second inter-layer insulator 3-2. In the chemical vapor deposition process, dimethyl-aluminum-hydride is used for conducting a bubbling with hydrogen gas. The substrate temperature is set at 150° C. The thickness of the aluminum film 62 is about 300 nanometers whereby the hole 3a of 0.3 micrometers in diameter is completely filled with the aluminum film 62.

Figure 9C:
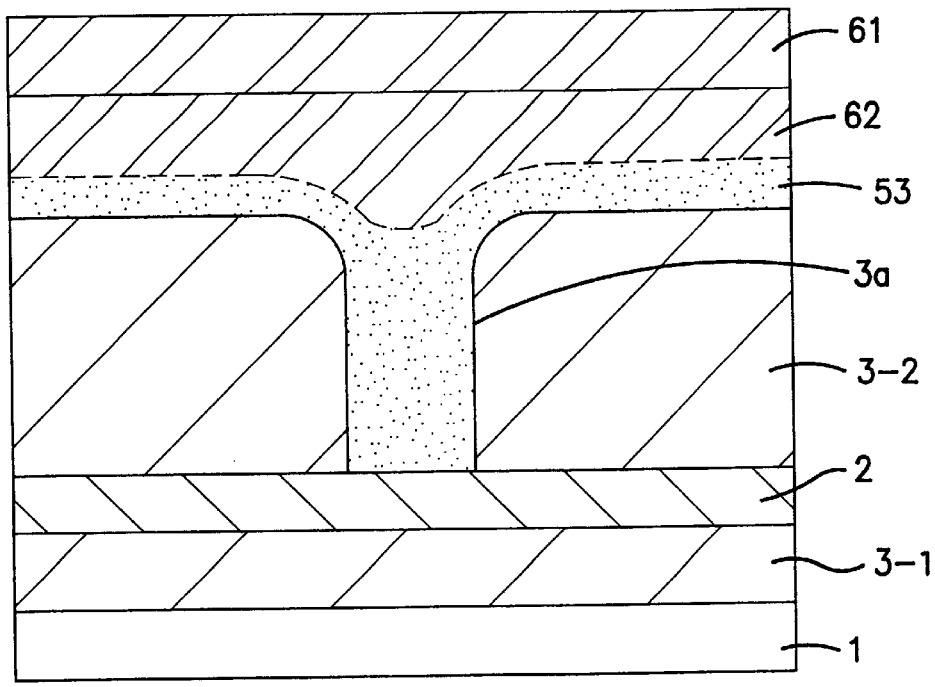

With reference to FIG. 9C, an Al—Cu film 61 is deposited by a sputtering process at a substrate temperature of 400° C. In this process, titanium atoms in the titanium film 51 are reacted with aluminum atoms in the aluminum layer deposited by the chemical vapor deposition whereby an aluminum titanium alloy layer 53 is formed which extends over the second inter-layer insulator 3-2 and within the hole 3a. As a result, the hole 3a is filled with the aluminum titanium alloy layer 53.

Figure 9D:
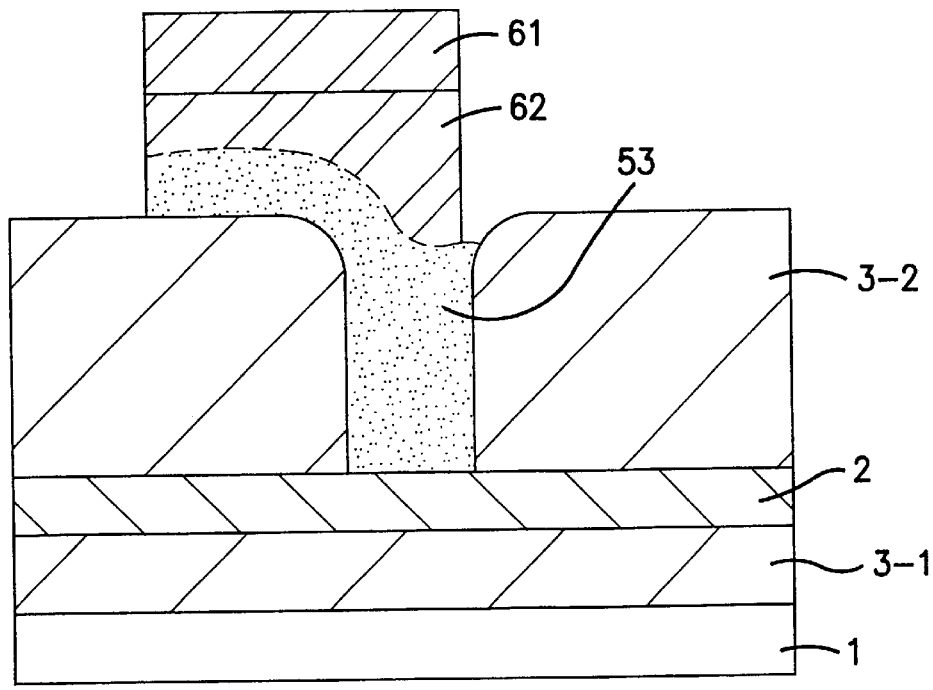

With reference to FIG. 9D, a photo-resist pattern is formed over the Al—Cu film 61 by a photo-lithography process so that the laminations of the Al—Cu film 61, the aluminum layer 62 and the Al—Ti alloy film 53 over the second inter-layer insulator 3-2 are patterned by a dry etching process using the photo-resist as a mask. Even if the photo-resist pattern is displaced from the hole 3a by error and an over-etching is carried out, then the thickness increased portion of the Al—Ti alloy film 53 over the curved shape edge portion of the hole can serve as an etching stopper which is capable of preventing any etching to the Al—Ti alloy film 53 in the upper portion of the hole. This allows a high yield of the semiconductor devices. The fabrication steps for the semiconductor device may be reduced and the manufacturing cost for the semiconductor device may also be reduced.

Figure 10:
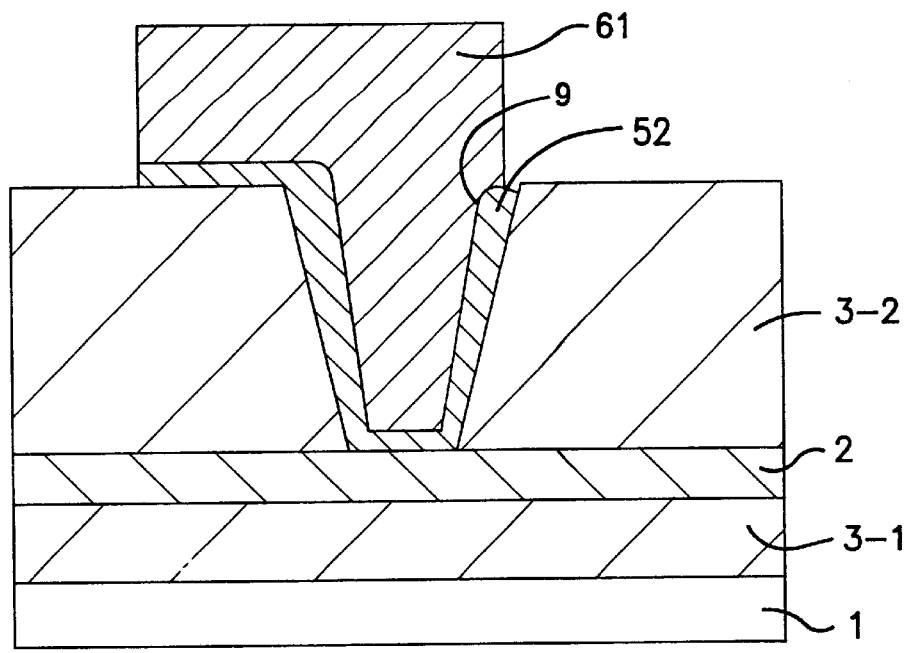
FIG. 10 is a fragmentary cross sectional elevation view illustrative of a semiconductor device with a base layer formed in a hole in a third embodiment in accordance with the present invention.

A third embodiment according to the present invention will be described in detail with reference to FIG. 10 which is illustrative of a semiconductor device with a base layer formed in a hole. A novel semiconductor device has the following structure. A first inter-layer insulator 3-1 is formed on a silicon substrate 1. A first level interconnection 2 or a bottom level interconnection is formed which extends over the first inter-layer insulator 3-1. A second inter-layer insulator 3-2 is formed over the first level interconnection 2. A hole such as a via hole or a contact hole is formed in the second inter-layer insulator 3-2 so that the hole reaches a top of a part of the first level interconnection 2. The hole has tapered side walls so that the hole decreases in diameter downwardly. A base layer 52 is provided which extends on a bottom portion of the hole, tapered side walls of the hole, and also extends over a part of a top surface of the second inter-layer insulator 3-2. In one side, the base layer 52 extends up to the upper portion of the hole, but does not extend over the second inter-layer insulator 3-2. In another side, the base layer 52 not only extends on the entire of the tapered side walls of the hole but also extends over the second inter-layer insulator 3-2 in the vicinity of the hole. The base layer 52 varies in thickness which is measured in a direction vertical to the surface of the base layer so that the base layer 52 on the upper portion of the hole is thicker than any other parts of the base layer extending over the top surface of the second inter-layer insulator 3-2 and also extending on the tapered side walls of the hole and the bottom of the hole. An effective thickness measured in an elevational direction of the base layer 52 over the curved shape edge portion of the hole is thicker than the effective thickness of the base layer 52 over the top surface of the second inter-layer insulator 3-2. The effective thickness is here defined to be a thickness when measured in the elevational direction along which the hole extends. The base layer 52 may comprise a titanium nitride layer or laminations of the titanium layer and the titanium nitride layer. A metal layer 61 is provided not only over the hole but also within the hole. A part of the metal layer 61 selectively extends over and in the vicinity of the upper portion of the hole so that the part of the metal layer 61 serves as a second level interconnection or a top level interconnection, whilst the remaining part of the metal layer 61 exists within the hole to fill the hole so that the remaining part of the metal layer serves as a contact layer which provides an electrical connection between the first level interconnection 2 and the second level interconnection. In the above one side, the metal layer 61 extends up to over the upper portion of the hole but does not extend over the top surface of the second inter-layer insulator 3-2. In the above other side, the metal layer 61 extends not only over the entire of the tapered side wall of the hole but also extends over the top surface of the second inter-layer insulator 3-2, however, in the vicinity of the hole. The metal layer 61 may comprise an Al—Cu layer 61 or a lamination of an Al—Ti alloy layer and an Al—Cu layer 61.

The titanium nitride layer 52 has a lower etching rate than that of the aluminum containing layer. The above thickness-increased portion of the base layer 52 over the curved shape edge portion of the hole serves as an etching stopper which prevents the metal layer 61 in the upper portion of the hole from being etched by a dry etching process which is carried out for patterning the metal layer 61 to define the second level interconnection even if the dry etching process is not so excessive over-etching. Even if a photo-resist pattern to be used for pattering the second level interconnection is displaced from the hole 3a by error and an over-etching is carried out, then the thickness increased portion of the base layer 52 over the upper portion of the hole can serve as an etching stopper which is capable of preventing any etching to the Al—Cu film 61 in the upper portion of the hole. This allows a high yield of the semiconductor devices. The fabrication steps for the semiconductor device may be reduced and the manufacturing cost for the semiconductor device may also be reduced.

Figure 11:
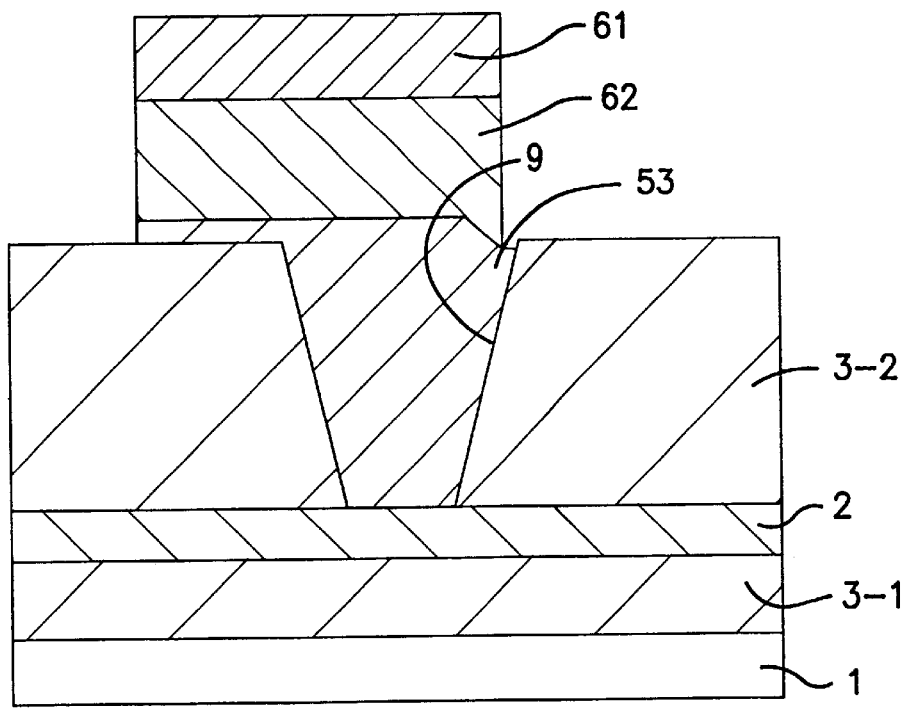
FIG. 11 is a fragmentary cross sectional elevation view illustrative of a semiconductor device with a base layer formed in a hole in a fourth embodiment in accordance with the present invention.

A fourth embodiment according to the present invention will be described in detail with reference to FIG. 11 which is illustrative of a semiconductor device with a base layer formed in a hole. A novel semiconductor device has the following structure. A first inter-layer insulator 3-1 is formed on a silicon substrate 1. A first level interconnection 2 or a bottom level interconnection is formed which extends over the first inter-layer insulator 3-1. A second inter-layer insulator 3-2 is formed over the first level interconnection 2. A hole 3a such as a via hole or a contact hole is formed in the second inter-layer insulator 3-2 so that the hole 3a reaches a top of a part of the first level interconnection 2. The hole 3a has tapered side walls so that the hole 3a decreases in diameter downwardly. A base layer 53 is provided which extends within the hole and over a part of a top surface of the second inter-layer insulator 3-2. In one side, the base layer 53 extends up to a part of the upper portion of the hole, but does not extend over the top surface of the second inter-layer insulator 3-2. In another side, the base layer 53 not only extends on the entire of the tapered side wall of the hole but also extends over the second inter-layer insulator 3-2 in the vicinity of the hole. The base layer 53 varies in effective thickness which is measured in an elevational direction along which the hole 3a extends so that the base layer 53 on the upper portion is thicker in elevational direction than the parts of the base layer 53 over the second inter-layer insulator 3-2. The effective thickness measured in an elevational direction of the base layer over the upper portion of the hole is thicker than the effective thickness of the base layer over the top surface of the second inter-layer insulator 3-2. The effective thickness is here defined to be a thickness when measured in the elevational direction along which the hole extends. The base layer 53 may comprise an electrically conductive film such as aluminum titanium film which, however, has a lower etching rate than that of aluminum containing metal layer so that the base layer 53 can serve as an etching stopper. A metal layer is provided on the base layer 53. The metal layer selectively extends over the base layer 53 so that the part of the metal layer serves as a second level interconnection or a top level interconnection. In the above one side, the metal layer extends up to over the upper portion of the hole but does not extend over the top surface of the second inter-layer insulator 3-2. In the above other side, the metal layer extends not only over the entire of the tapered side wall of the hole but also extends over the top surface of the second inter-layer insulator 3-2, however, in the vicinity of the hole. The metal layer comprises laminations of an aluminum layer 62 in contact with the aluminum titanium layer 53 and an Al—Cu layer 61.

The aluminum titanium base layer has a lower etching rate than that of the aluminum containing layer such as Al—Cu layer. The above thickness-increased portion of the base layer 53 over the upper portion of the hole serves as an etching stopper which prevents the base layer in the upper portion of the hole from being etched by a dry etching process which is carried out for patterning the metal layer to define the second level interconnection even if the dry etching process is not so excessive over-etching. Even if a photo-resist pattern to be used for pattering the second level interconnection is displaced from the hole 3a by error and an over-etching is carried out, then the thickness increased portion of the base layer 53 over the upper portion of the hole can serve as an etching stopper which is capable of preventing any etching to the base layer 53 in the upper portion of the hole. This allows a high yield of the semiconductor devices. The fabrication steps for the semiconductor device may be reduced and the manufacturing cost for the semiconductor device may also be reduced.

Figure 12:
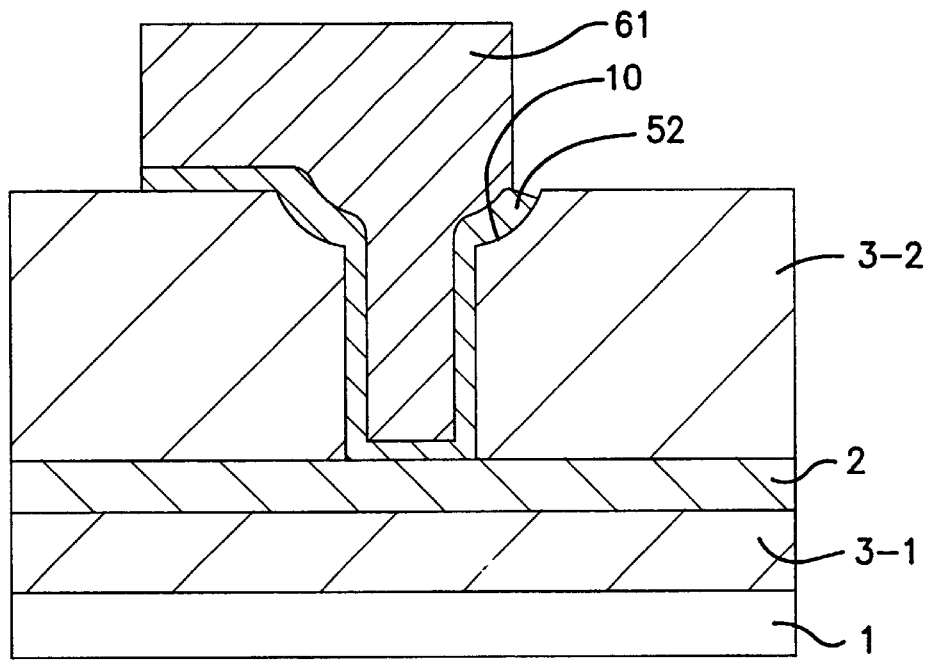
FIG. 12 is a fragmentary cross sectional elevation view illustrative of a semiconductor device with a base layer formed in a hole in a fifth embodiment in accordance with the present invention.

A fifth embodiment according to the present invention will be described in detail with reference to FIG. 12 which is illustrative of a semiconductor device with a base layer formed in a hole. A novel semiconductor device has the following structure. A first inter-layer insulator 3-1 is formed on a silicon substrate 1. A first level interconnection 2 or a bottom level interconnection is formed which extends over the first inter-layer insulator 3-1. A second inter-layer insulator 3-2 is formed over the first level interconnection 2. A hole such as a via hole or a contact hole is formed in the second inter-layer insulator 3-2 so that the hole reaches a top of a part of the first level interconnection 2. The hole has an upper portion which is widen in diameter so as to form wet-etched upper portions of the hole wherein the wet-etched upper portions have been formed by a wet etching or an isotropic etching process. A base layer 52 is provided which extends on a bottom portion of the hole, vertical side walls of the hole, and the upper portion of the hole and also extends over a part of a top surface of the second inter-layer insulator 3-2. In one side, the base layer 52 extends up to a part of the upper portion of the hole or to a lower half part of the wet-etched upper portion of the hole, but does not extend over an upper half part of the wet-etched upper portion of the hole. In another side, the base layer 52 not only extends on the entire of the wet-etched upper portion of the hole but also extends over the second inter-layer insulator 3-2 in the vicinity of the hole. The base layer 52 varies in thickness which is measured in a direction vertical to surface of the base layer 52 so that the base layer 52 on the wet-etched upper portion is thicker than any other parts of the base layer extending over the top surface of the second inter-layer insulator 3-2 and also extending on the vertical side walls of the hole and the bottom of the hole. An effective thickness measured in an elevational direction of the base layer 52 over the wet-etched upper portion of the hole is thicker than the effective thickness of the base layer 52 over the top surface of the second inter-layer insulator 3-2. The effective thickness is here defined to be a thickness when measured in the elevational direction along which the hole extends. The base layer 52 may comprises a titanium nitride layer or a lamination of a titanium layer and a titanium nitride layer. A metal layer 61 is provided not only over the hole but also within the hole. A part of the metal layer 61 selectively extends over and in the vicinity of the wet-etched upper portion of the hole so that the part of the metal layer serves as a second level interconnection or a top level interconnection, whilst the remaining part of the metal layer 61 exists within the hole to fill the hole so that the remaining part of the metal layer serves as a contact layer which provides an electrical connection between the first level interconnection 2 and the second level interconnection. In the above one side, the metal layer 61 extends up to over the lower half part of the wet-etched upper portion of the hole but does not extend over the upper half part of the wet-etched upper portion of the hole and also does not extend over the top surface of the second inter-layer insulator 3-2. In the above other side, the metal layer 61 extends not only over the entire of the wet-etched upper portion of the hole but also extends over the top surface of the second inter-layer insulator 3-2, however, in the vicinity of the hole. The metal layer 61 may comprise an Al—Cu layer or laminations of an Al—Ti alloy layer and an Al—Cu layer.

The titanium nitride layer has a lower etching rate than that of the aluminum containing layer. The above thickness-increased portion of the base layer 52 over the wet-etched upper portion of the hole serves as an etching stopper which prevents the metal layer 61 in the upper portion of the hole from being etched by a dry etching process which is carried out for patterning the metal layer 61 to define the second level interconnection even if the dry etching process is not so excessive over-etching. Even if a photo-resist pattern to be used for pattering the second level interconnection is displaced from the hole 3a by error and an over-etching is carried out, then the thickness increased portion of the base layer 52 over the upper portion of the hole can serve as an etching stopper which is capable of preventing any etching to the metal layer 61 in the upper portion of the hole. This allows a high yield of the semiconductor devices. The fabrication steps for the semiconductor device may be reduced and the manufacturing cost for the semiconductor device may also be reduced.

Figure 13:
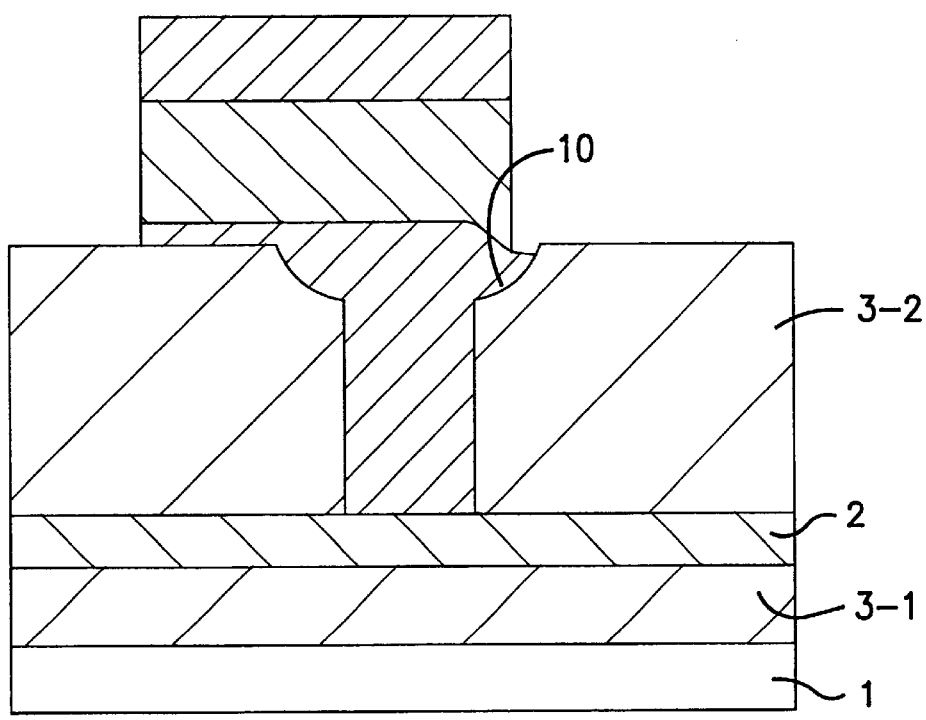
FIG. 13 is a fragmentary cross sectional elevation view illustrative of a semiconductor device with a base layer formed in a hole in a sixth embodiment in accordance with the present invention.

A sixth embodiment according to the present invention will be described in detail with reference to FIG. 13 which is illustrative of a semiconductor device with a base layer formed in a hole. A novel semiconductor device has the following structure. A first inter-layer insulator 3-1 is formed on a silicon substrate 1. A first level interconnection 2 or a bottom level interconnection is formed which extends over the first inter-layer insulator 3-1. A second inter-layer insulator 3-2 is formed over the first level interconnection 2. A hole 3a such as a via hole or a contact hole is formed in the second inter-layer insulator 3-2 so that the hole 3a reaches a top of a part of the first level interconnection 2. The hole 3a has an upper portion which is widen in diameter so as to form wet-etched upper portions of the hole. A base layer 53 is provided which extends within the hole and over a part of a top surface of the second inter-layer insulator 3-2. In one side, the base layer 53 extends up to a part of the upper portion of the hole or to a lower half part of the wet-etched upper portion of the hole, but does not extend over an upper half part of the wet-etched upper portion of the hole. In another side, the base layer 53 not only extends on the entire of the wet-etched upper portion of the hole but also extends over the second inter-layer insulator 3-2 in the vicinity of the hole. The base layer 53 varies in effective thickness which is measured in an elevational direction along which the hole 3a extends so that the base layer 53 on the wet-etched upper portion is thicker in elevational direction than the parts of the base layer 53 over the second inter-layer insulator 3-2. The effective thickness measured in an elevational direction of the base layer 53 over the wet-etched upper portion of the hole is thicker than the effective thickness of the base layer over the top surface of the second inter-layer insulator 3-2. The effective thickness is here defined to be a thickness when measured in the elevational direction along which the hole extends. The base layer 53 may comprise an electrically conductive film such as aluminum titanium film which, however, has a lower etching rate than that of aluminum containing metal layer so that the base layer 53 can serve as an etching stopper. A metal layer is provided on the base layer 53. The metal layer selectively extends over the wet-etched upper portion of the hole and the top surface of the second inter-layer insulator 3-2 so that the part of the metal layer serves as a second level interconnection or a top level interconnection. In the above one side, the metal layer does not extend over the upper half part of the wet-etched upper portion of the hole and also does not extend over the top surface of the second inter-layer insulator 3-2. In the above other side, the metal layer extends not only over the entire of the wet-etched upper portion of the hole but also extends over the top surface of the second interlayer insulator 3-2, however, in the vicinity of the hole. The metal layer may comprise laminations of an aluminum layer 62 and an Al—Cu layer 61.

The aluminum titanium base layer 53 has a lower etching rate than that of the aluminum containing layer such as Al—Cu layer 61. The above thickness-increased portion of the base layer 53 over the wet-etched upper portion of the hole serves as an etching stopper which prevents the base layer in the upper portion of the hole from being etched by a dry etching process which is carried out for patterning the metal layer to define the second level interconnection even if the dry etching process is not so excessive over-etching. Even if the photo-resist pattern is displaced from the hole 3a by error and an over-etching is carried out, then the thickness increased portion of the Al—Ti alloy film 53 over the wet-etched upper portion of the hole can serve as an etching stopper which is capable of preventing any etching to the Al—Ti alloy film 53 in the upper portion of the hole. This allows a high yield of the semiconductor devices. The fabrication steps for the semiconductor device may be reduced and the manufacturing cost for the semiconductor device may also be reduced.

In the foregoing embodiments, the base layer comprises the titanium nitride layer or the aluminum titanium layer. Notwithstanding, various refractory metal silicide layers such as titanium silicide layer, tantalum silicide layer, and tungsten silicide layer as well as various metal nitride layers such as tantalum nitride layer and tungsten nitride layer and in addition laminations of those layers are also available provided that the base layer has a lower etching rate than that of the metal layer of the second level interconnection.

Further, in the foregoing embodiments, the aluminum containing layer is deposited by a sputtering method at an increased substrate temperature or a chemical vapor deposition method. Other deposition methods such as a high pressure sputtering method or an ionized sputtering method is also available. The electrically conductive layer filled within the hole may be Cu-containing alloy.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of filling a through hole in an insulation layer in a semiconductor device comprising the steps of:

forming a hole in the insulation layer so that said hole has an upper portion which has a larger diameter than other portions thereof;

depositing a base layer which extends on at least a part of said upper portion of said hole as well as extends over at least a part of a top surface of said insulation layer in the vicinity of said hole, so that said base layer extending on said upper portion of said hole has an effective thickness in an elevational direction, which is thicker than a thickness of said base layer over said insulation film;

depositing a metal layer on said base layer; and subjecting said metal layer on said base layer to an anisotropic etching to selectively etch said metal layer and said base layer so that at least a part of said base layer on said upper portion of said hole remains, while said metal layer said base layer over said insulation layer are etched.

2. The method as claimed in claim 1, wherein said base layer is deposited on said upper portion of said hole to have a thickness in a direction perpendicular to a surface of said base layer, which is thicker than said base layer extending over said insulation film.

3. The method as claimed in claim 1, wherein said base layer is deposited on said upper portion of said hole to have a thickness in a direction perpendicular to a surface of said base layer, which is thicker than another parts of said base layer.

4. The method as claimed in claim 1, wherein said upper portion of said hole is etched by a sputtering method to form a curved edge with a constant radius.

5. The method as claimed in claim 1, wherein said hole is formed by an anisotropic etching under such conditions as to form tapered side walls so that a diameter of said hole is decreased downwardly.

6. The method as claimed in claim 1, wherein said hole is formed by an isotropic etching method and a subsequent isotropic etching method so that said upper portion of said hole has a wet-etched portion with a curved shape.

7. The method as claimed in claim 1, wherein said base layer is deposited within said hole to fill said hole and also over said insulation layer.

8. The method as claimed in claim 1, wherein said base layer is etched to finally extend on one side of said upper portion of said hole.

9. The method as claimed in claim 1, wherein said base layer is etched to finally extend on opposite sides of said upper portion of said hole.

10. The method as claimed in claim 1, wherein said base layer is deposited to extend on a bottom and side walls of said hole as well as said upper portions of said hole and also extend over said insulation film, and then a metal layer is deposited on said base layer to fill said hole.

11. A method of filling a through hole in an insulation layer in a semiconductor device comprising the steps of:

forming a hole in the insulation layer, the hole having a rim that is curved in vertical cross section so as to avoid forming a sharp corner at the rim, the curved rim smoothly joining an interior wall of the hole with a top surface of the insulation layer;

depositing a base layer on the curved rim, the interior wall of the hole, and at least a part of the top surface of the insulation layer near the hole, said base layer having a greater thickness on the curved rim than on the interior wall of the hole and the top surface of the insulation layer;

depositing a metal layer on said base layer; and anisotropic etching said metal layer and said base layer so that a part of said base layer on the curved rim remains while etching said metal layer and said base layer over said insulation layer.

12. The method of claim 11, wherein said base layer comprises two layers, namely a titanium layer that has a constant thickness on the curved rim, the interior wall of the hole, and the top surface of the insulation layer, and a titanium nitride layer that has a greater thickness on the curved rim than on the interior wall of the hole and the top surface of the insulation layer.

* * * * *